United States Patent [19]

Tanaka

[11] 4,184,121

[45] Jan. 15, 1980

[54] WIDE WINDOW TUNING SYSTEM

[75] Inventor: Akio Tanaka, Chicago, Ill.

[73] Assignee: Zenith Radio Corporation, Glenview, Ill.

[21] Appl. No.: 718,746

[22] Filed: Aug. 30, 1976

[51] Int. Cl.$^2$ .......................... H04B 1/32; H04N 5/50
[52] U.S. Cl. ..................................... 325/464; 358/193
[58] Field of Search ............................... 325/417–420,
325/452, 453, 457–459, 464, 465, 468, 469, 470;
358/191, 193; 331/1 A, 25

[56] References Cited

U.S. PATENT DOCUMENTS

| | | | |
|---|---|---|---|
| 3,496,473 | 2/1970 | Seppeler et al. | 325/453 X |
| 3,835,384 | 9/1974 | Liff | 325/464 X |
| 3,956,710 | 5/1976 | Seitz et al. | 331/25 X |
| 3,961,266 | 6/1976 | Tanaka | 325/452 |
| 4,009,439 | 2/1977 | Rast | 325/468 |
| 4,025,953 | 5/1977 | Sidens | 325/464 X |
| 4,031,549 | 6/1977 | Rast et al. | 358/193 |
| 4,038,689 | 7/1977 | Rzeszewski et al. | 325/453 X |

Primary Examiner—Robert L. Griffin
Assistant Examiner—Aristotelis M. Psitos

[57] ABSTRACT

A two mode tuning system includes channel counters for determining system tuning by counting the LOF, a channel number comparator comparing the derived channel number with a desired channel number and PLL including a phase comparator for comparing equality pulses from the channel number comparator with a reference frequency. In the first mode the system tunes to a single frequency with the channel counters being operated continuously and the PLL tuning to the frequency corresponding to the selected channel number. In the second mode the system tunes to a frequency window with the channel counters being asynchronously sampled and an AFC circuit maintaining tuning within the window. Tuning cycle control means initiate the single frequency mode in response to a channel number input or an out-of-window tuning indication. The system switches to the tuning window mode after 200ms. Initially tuning to the "center of the tuning window" relaxes the AFC requirements for a wide window system.

38 Claims, 13 Drawing Figures

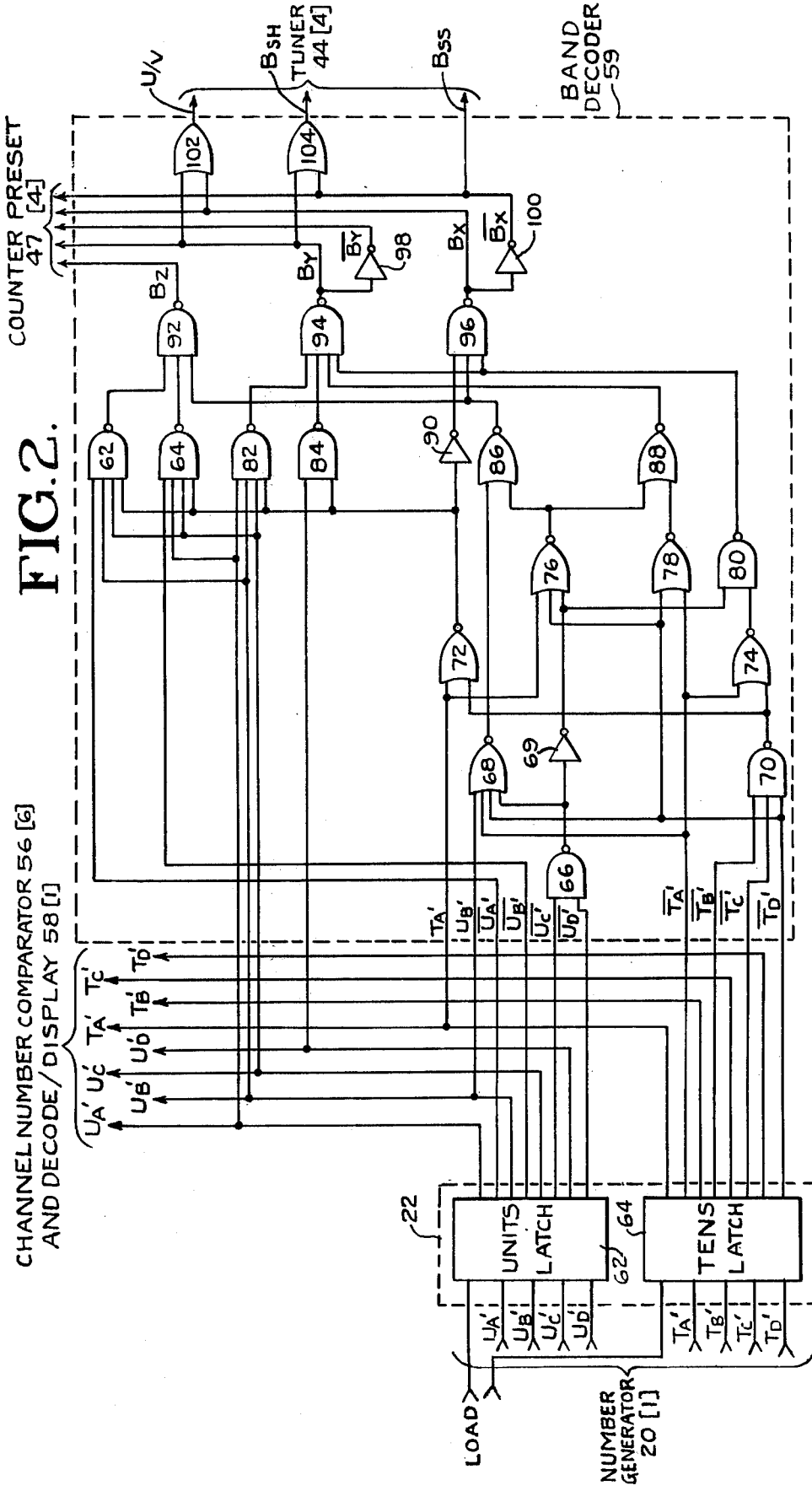

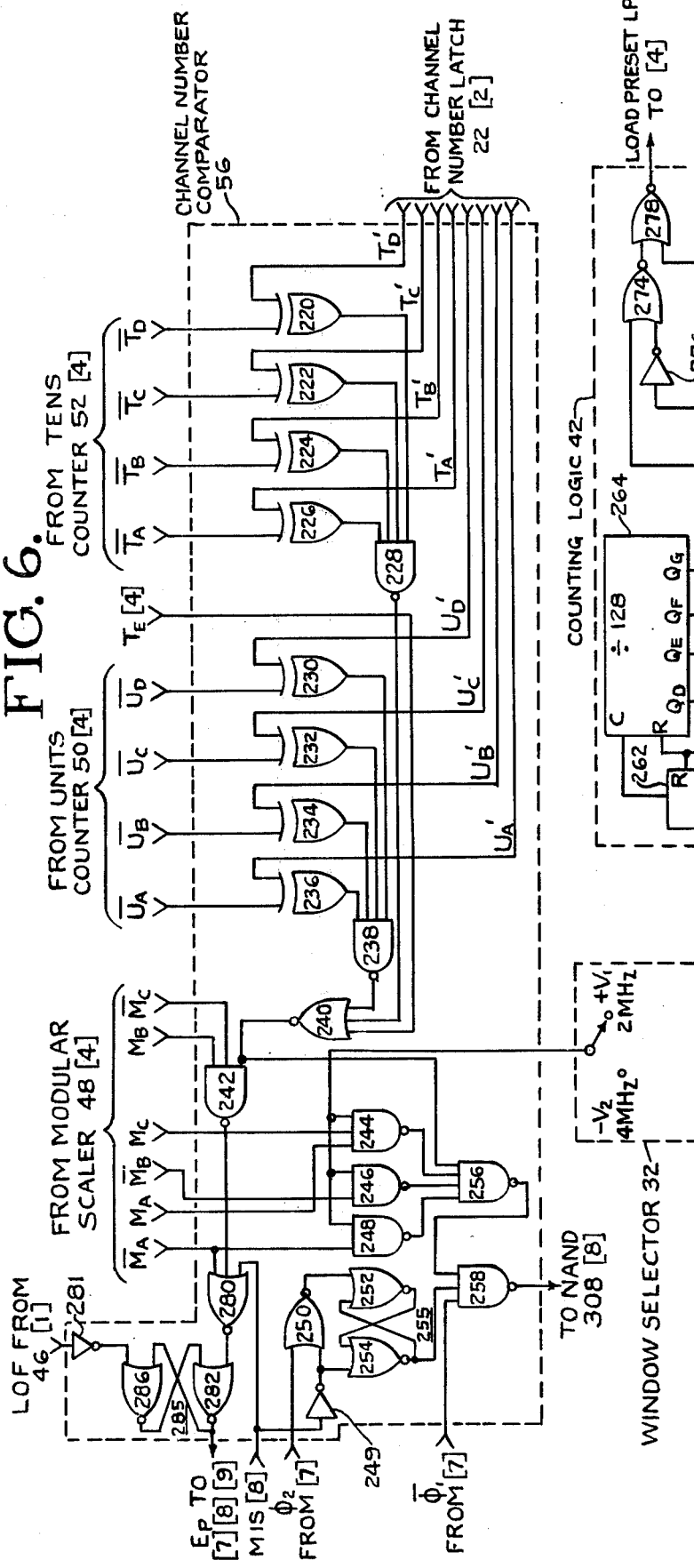
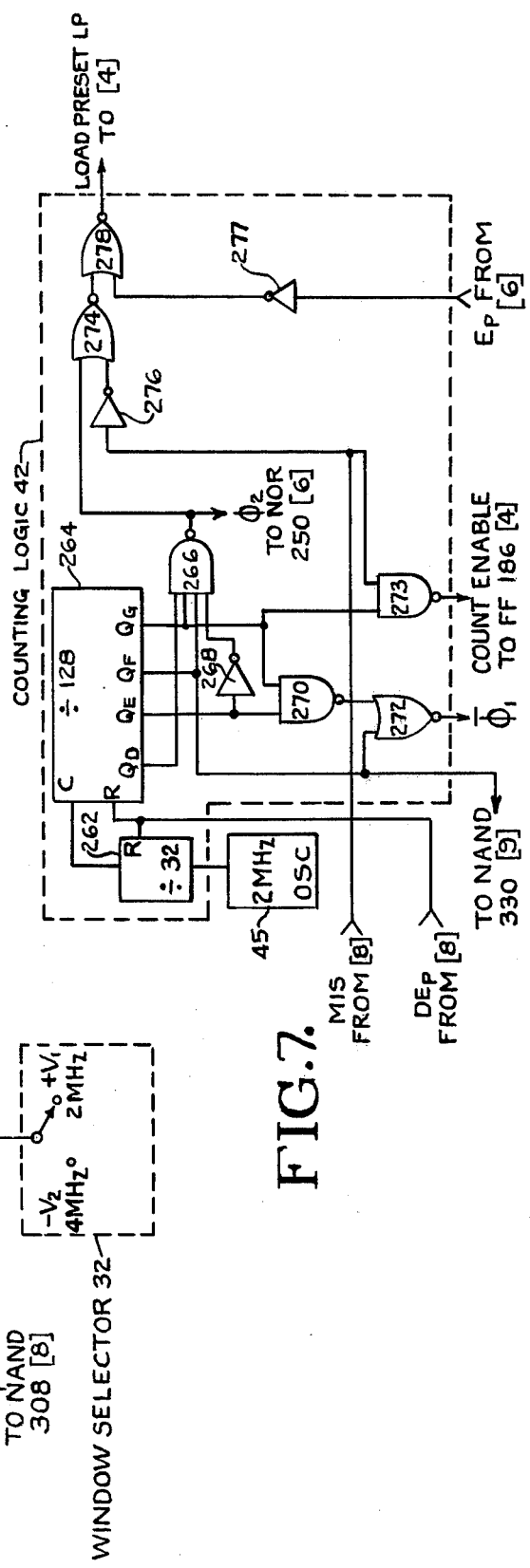
FIG. 6.
FIG. 7.

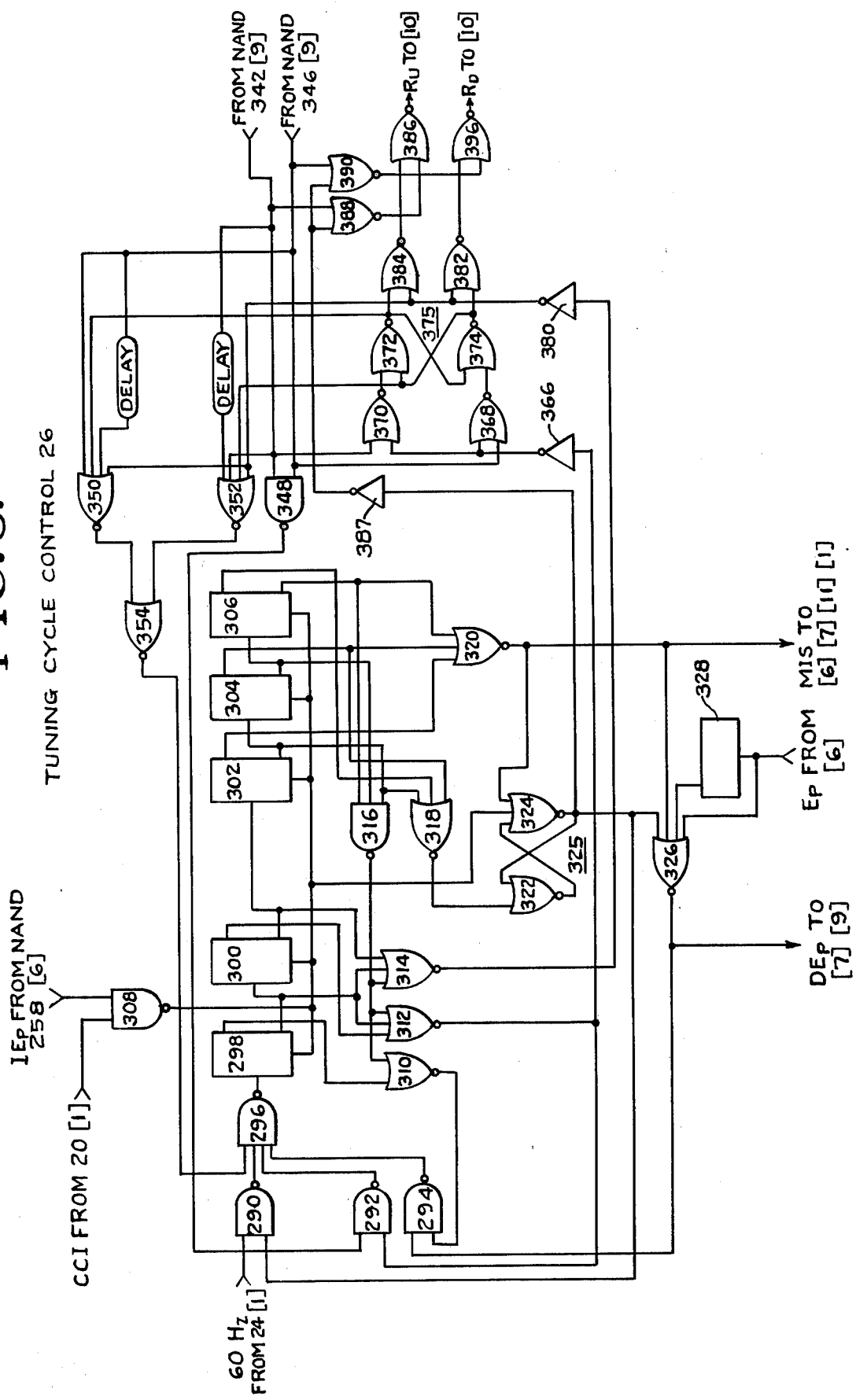
FIG. 8. TUNING CYCLE CONTROL 26

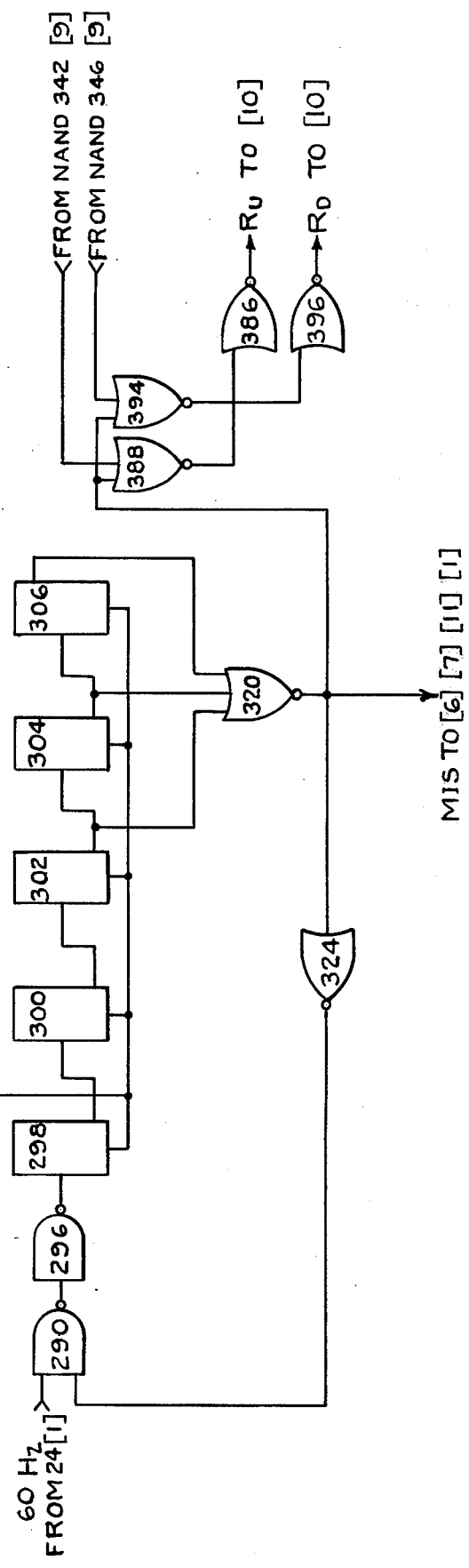

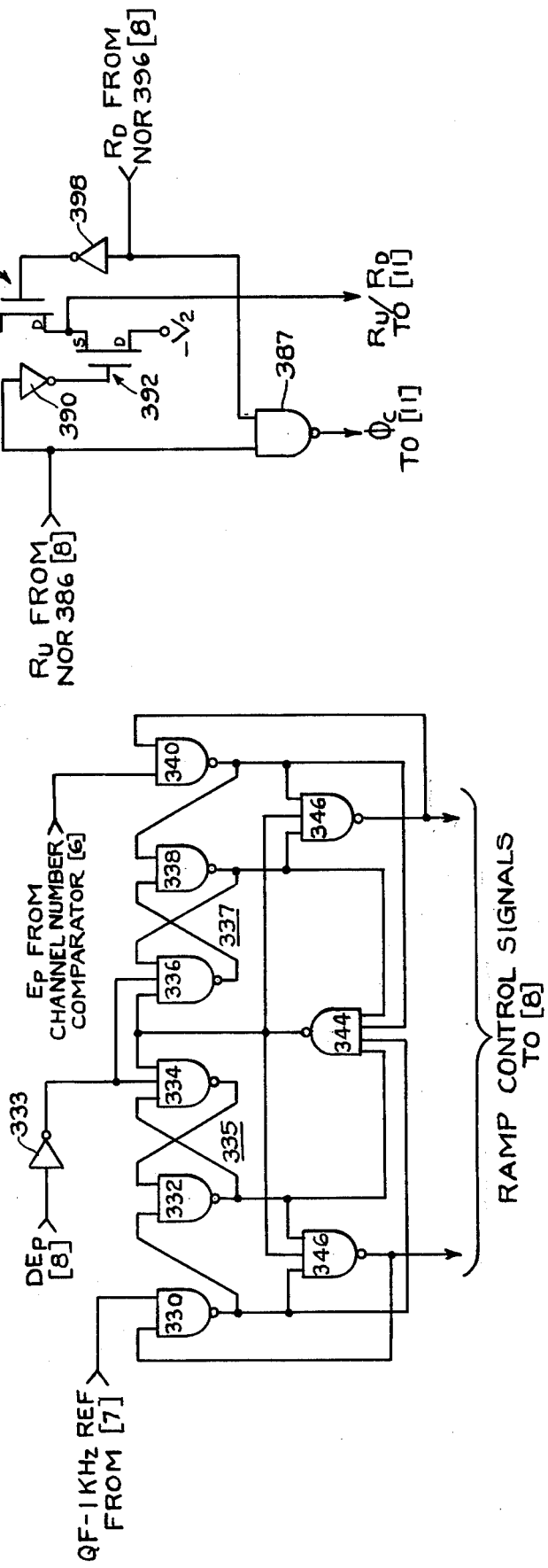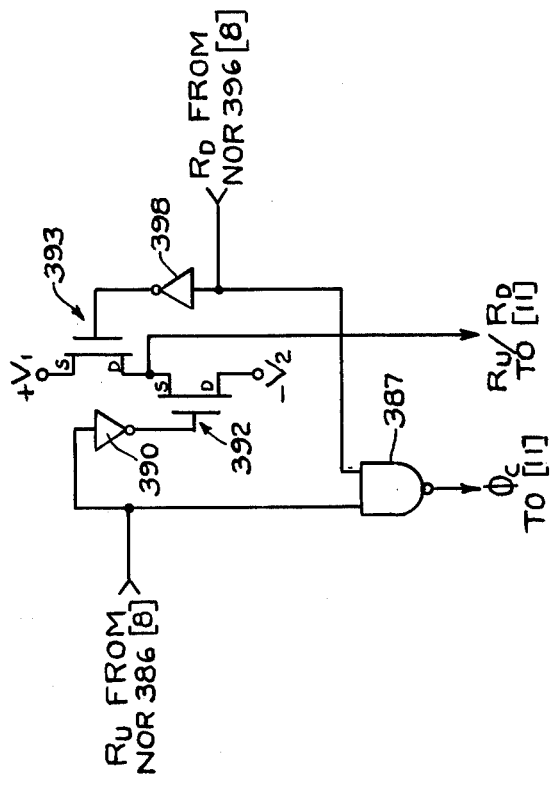

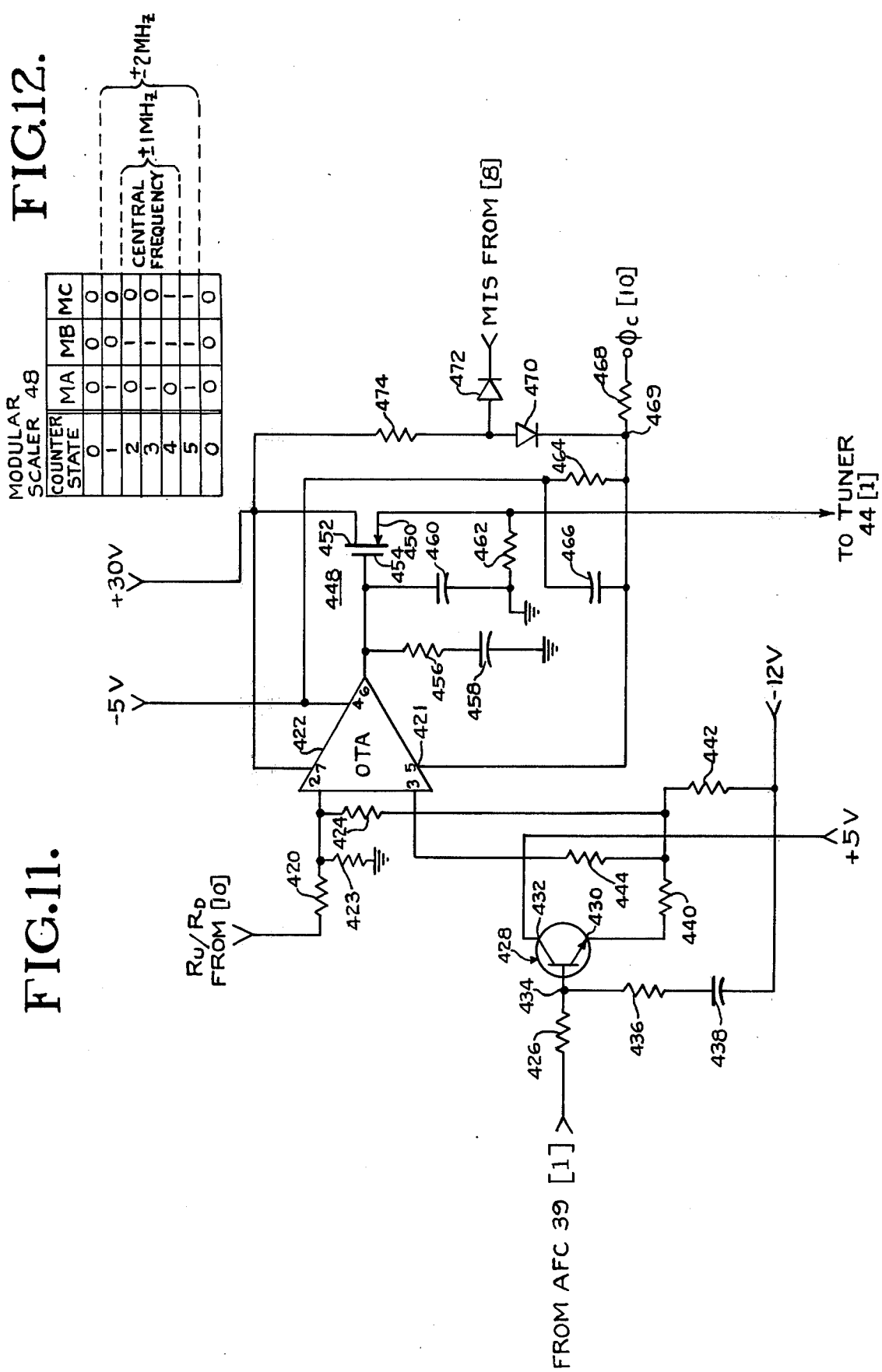

WIDE WINDOW TUNING SYSTEM

CROSS REFERENCE TO RELATED PATENT

This application discloses apparatus similar to that in U.S. Pat. No. 3,961,266 issued June 1, 1976 to Akio Tanaka and assigned to Zenith Radio Corporation.

BACKGROUND OF THE INVENTION

The invention relates generally to all-electronic television tuning systems. More particularly it relates to a digital tuning system employing channel number counters for establishing and maintaining tuning in accordance with a selected channel number, and specifically to such a system having a "tuning window" (e.g. a restricted region of acceptable frequencies).

DESCRIPTION OF THE PRIOR ART

U.S. Pat. No. 3,961,266 entitled "Channel Seeking Tuning System", in the name of Akio Tanaka and assigned to Zenith Radio Corporation, describes a television tuning system with a tuning window. It employs channel number computing circuitry to adjust the television receiver tuner to receive signals within a non-zero frequency interval about the picture carrier frequency corresponding to any selected FCC designated channel. This restricted frequency region defines a tuning window around the allocated frequency of the selected channel. The background of the patent contains an extensive review of prior art digital tuning systems, pointing out the advantages and disadvantages of each and clearly delineating the advantages of a system with a tuning window.

It will be appreciated that the tuning window provides a "quiet space" within which an automatic frequency control circuit (AFC) may operate. Should the transmitted signal disappear for any reason, the system stays tuned within the window. The obvious advantage of such systems is that they permit operations with "off-frequency" carrier signals, while retaining the essential feature of assuring that the displayed channel number is representative of actual system tuning.

While the above patent taught windows of different widths, in its described preferred embodiment a window of $\pm\frac{1}{2}$MHz was specified. This necessitated a disproportionate AFC range of $\pm 1$ MHz, since there was no way to know in which portion of the frequency window an "off-frequency" carrier might be nor where actual system tuning would be (within the window) when released to AFC. A wider window dictated a correspondingly broader AFC pull-in range to assure that a signal located at one extreme of the window would be "captured" or tuned in. Clearly a wide window system that is to be capable of receiving severely off-frequency carriers, such as those associated with CATV, MATV and various translator systems in use, would need a wide range AFC to be practicable.

Conventional AFC systems are limited to capture ranges of $\pm 2$ MHz. Wider range AFC systems up to $\pm 3$ MHz are available, but may not be economically feasible nor easily implemented in a receiver. In some situations it is even desirable to have nonsymmetrical AFC's to assist pull-in from one side. In addition, the desire to provide a system with the capability of automatically tuning in signals which may be offset from their FCC-allocated picture carrier frequency by as much as 2MHz gave impetus to development of a new tuning system. The tuning system of the invention will be seen to possess the benefits of a wide tuning window while imposing only conventional requirements on the AFC.

To elaborate on the problem more fully, CATV television systems convert UHF channels to standard VHF broadcast frequencies (or to mid and superband cable frequencies). The conversion equipment is not always crystal controlled and may introduce frequency errors. MATV systems also employ converters and their signals often deviate substantially from FCC authorized frequencies. Video recorders represent an additional source of non-standard carrier frequencies. Some systems even have an intentionally offset carrier: For example, one CATV system in Pennsylvania uses a 1.25 MHz offset to place the picture carrier on an even 6 MHz harmonic. Windowed tuning systems, with appropriate AFC circuits, can even accommodate such disparate signals.

SUMMARY OF THE INVENTION

In accordance with the invention, a method of operating a television receiver for receiving any channel in the television band is set forth which includes the steps of: selecting a desired band; initially tuning the receiver to a particular frequency within the selected channel band; establishing a window defining a restricted range of frequencies about that particular frequency; and maintaining receiver tuning within the window. The inventive apparatus includes a window tuning system with the window-forming portion disabled to enable the system to be initially tuned to the particular frequency corresponding to the FCC-allocated channel number of the selected channel. The window is then established about that frequency, and the AFC enabled. Thus a large tuning window may be incorporated to accommodate off-frequency, non-standard broadcast signals without requiring a disproportionately wide-range AFC.

In the specific embodiment chosen for purposes of description, a digital phase lock loop (PLL) drives the local oscillator to a frequency corresponding to the channel number of the 6 MHz FCC-allocated frequency band. The window is then established about the tuned frequency and the AFC circuit enabled. Thus, by definition, the system is always initially tuned to the center of its tuning window and the AFC circuit needs a pull-in range of $\pm$one-half the window width. Thus all of the advantages of a receiver with a tuning window are obtainable with conventional AFC requirements.

Further, the novel tuning system of the present invention is capable of receiving signals having substantial carrier frequency deviations and is readily adaptable to any varactor diode tuner. When tuned, the channel number display remains correct despite these carrier frequency deviations.

OBJECTS OF THE INVENTION

An object of this invention is to provide a novel television tuning system and method.

Another object of this invention is to provide an improved all-electronic all-channel television tuning system and method.

A further object of this invention is to provide an improved all-channel television tuning system capable of tuning to substantially off-frequency non-standard signals.

BRIEF DESCRIPTION OF THE DRAWINGS

Further objects and advantages of this invention will be apparent from reading the following specification in conjunction with the drawings in which:

FIG. 2 is the detail logic circuit of channel number latch 22 and band decoder 59.

FIG. 3 is a table of logic signals, corresponding to channel number inputs, for band decoder 59;

FIG. 6 is the detail logic circuitry of channel number comparator 56;

FIG. 7 is the detail logic circuit of counting logic 42;

FIG. 8 is the detail logic circuit of the actual implemented version of tuning cycle control 26.

FIG. 8A is the detail logic circuit of tuning cycle control 26 which does not include special provision for high speed channel acquisition;

FIG. 9 is the detail logic circuit of phase comparator 40;

FIG. 10 is the detail logic circuit of ramp control circuit 35;

FIG. 11 shows the details of the circuitry for tuning voltage source 36; and

FIG. 12 illustrates the state or count of modular scaler 48 and the corresponding output logic signal outputs.

LOGIC DEFINITIONS

Figure 1:
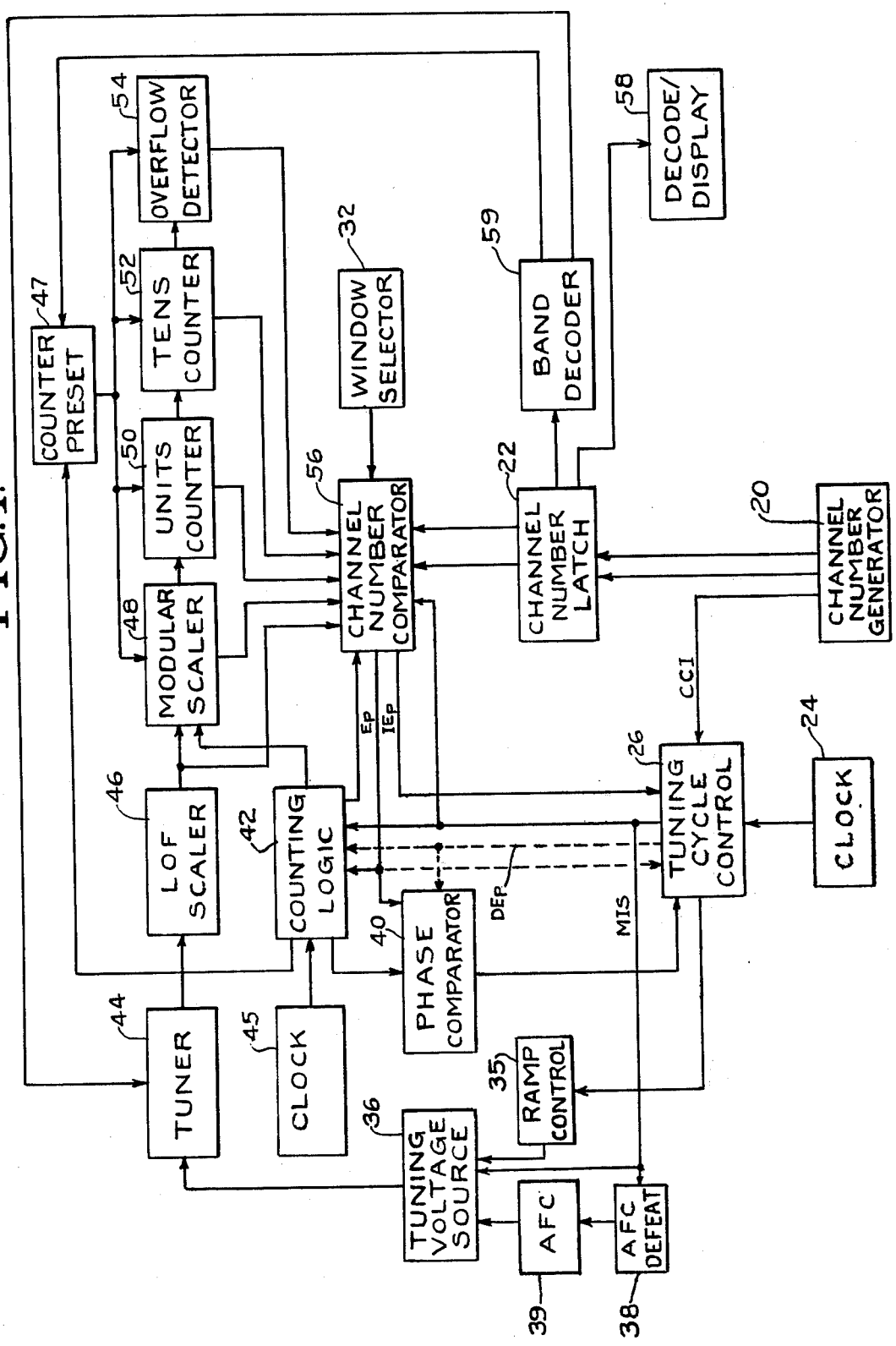
FIG. 1 is a block diagram of the tuning system of the invention.

For simplicity, only logic connections are shown in the figures and only voltage sources and grounds necessary to establish the logic control signal levels are shown. Positive logic is used throughout and logic gates are generally referred to by their functional names only, i.e., AND, NAND, OR, NOR and EXCLUSIVE OR. A "1" represents a high logic signal ($+V_1=5$ V d.c.) and a "0" corresponds to a low logic signal ($-V_2=-12$ V d.c.). Thus, an AND gate has its output at 1 only if all inputs are at 1; a NAND gate has its output at 0 only if all inputs are at 1; an OR gate has its output at 1 if any input is at 1; and a NOR gate has its output at 0 if any input is at 1. Inverters function to interchange the 1 and 0 levels. An EXCLUSIVE OR has a 0 at its output only when signals at all inputs are at the same level.

All binary representations are conventionally arranged in descending powers of 2 from left to right. Leads labelled with subscripts D, B, C and A and D', B', C' and A' interchangeably identify binary digits or bits as well as leads. Similarly, leads may be identified by the functional signals they carry. For convenience, leads connected to parts in another figure, in addition to their normal designations will, where practical, be followed by the appropriate figure number enclosed in brackets. The additional designations of "FROM" and "TO" indicate the source or destination of logic signals or connections.

The terms "input" and "output" generally indicate a device terminal unless signal is specified. $\phi$ generally represents a timing pulse signal and $\bar{\phi}$ its inverse or complement. If $\phi$ is 0, $\bar{\phi}$ is 1 and vice-versa. The term "inhibit" indicates the condition in which a gate output is no longer dependent upon signals applied to its remaining inputs. The term "enable" designates the condition in which a gate output is dependent upon the signals applied to its remaining inputs.

Flip flops will be referred to by the letters FF. Drawing representations of flip flops are standard with the lead locations indicating the terminal. The word terminal is omitted in most instances. For example, the "J and K terminals of flip flop 200" will be referred to as "J, K of FF 200". All flip flops of the J-K type are similar to RCA type CD 4027.

DESCRIPTION OF THE PREFERRED EMBODIMENT

General Operation

The system has two tuning modes, characterized as a "single frequency" mode and a "tuning window" mode. It incorporates LOF counters, including a modular scaler, for deriving the channel number corresponding to system tuning, a channel number comparator, a ramp control and tuning voltage source, means for generating desired channel numbers, a reference signal, a phase comparator, an AFC circuit, a channel number display and a tuning cycle control. When a channel number input is made, the system goes into full "ramping", senses when the desired frequency has been passed, operates for a fixed time in the single frequency mode (with a PLL) and releases to its tuning window mode with AFC. The additional complexity of 100% "ramping", (i.e. driving the varactor controlled oscillator to rapidly change frequency) until an overshoot condition is detected, is incorporated to shorten the channel acquisition or tuning time. In designing the system an arbitrary time limit of 200 milliseconds was established for tuning to any channel. With this limitation, it was felt that the ordinary PLL ramping was too slow and the additional circuitry was developed. This additional circuitry is not part of the present invention and is included because it is part of the actual integrated circuit implementation of the inventive tuning system. FIG. 8 shows the actual integrated circuit implementation. FIG. 8A is included to show the simplified version.

In the single frequency mode, the PLL is operational and the LOF channel counters continuously count the LOF pulses. The channel number comparator compares the LOF count number with the desired channel number input, supplying an equality pulse to the phase comparator (and resetting the channel counters) each time there is equality. The resetting is done between LOF pulses. The phase comparator is also supplied with a reference timing signal of approximately 1 KHz (actual frequency is 976.5625 Hz). The phase comparator compares the frequency and phase of the train of equality pulses from the channel number comparator with the frequency and phase of the 1 KHz reference timing signal.

The phase comparator output supplies the ramp control which, in turn, operates on the tuning voltage source for controlling system tuning. If the timing signal reference frequency is higher than the frequency of the train of equality pulses, the LOF is lower than the frequency corresponding to the desired channel number. Similarly, if the frequency of the train of equality pulses is higher than the timing signal reference frequency, the LOF is too high.

The LOF counters are under the control of counting logic. The counter presets are loaded during resetting of the counters between successive LOF pulses, thus insuring that all LOF pulses are counted. During single frequency operation a single residue state of the modular scaler is selected. Thus a comparator equality pulse occurs only when the units and tens counters correspond to the selected channel number tens and units digits and the state of the modular scaler indicates the predetermined residue. (For channels 2–83 the overflow counter must also go through its 00 count for reasons to be explained.)

It should be borne in mind that the system tunes without regard to the presence of a transmitted signal. The LOF being set to the appropriate frequency dictated by the desired channel number in the comparator constitutes tuning. When the system has been in its initial single frequency tuning mode for a predetermined time, the counting logic is reconfigured, the system goes into its tuning window mode and the AFC enabled. The initial-mode time interval is sufficient to insure tuning to the frequency corresponding to the desired channel number. As fully described in the referent Tanaka patent, the frequency window is conveniently established by asynchronous sampling of the channel counters and specifying the acceptable residues or states of the modular scaler. Proper tuning is indicated when the sampled LOF count satisfies the units and tens counters and the preselected residues.

While the system is in its tuning window mode, its operation is very similar to that described in the Tanaka patent. The counting logic establishes count, compare and reset intervals for asynchronous sampling of the LOF. The LOF pulses are counted during the count intervals, comparison between the derived channel number count and the selected channel number from the channel number latch is carried out during compare intervals. During reset intervals, the counters are reset and loaded for the next count interval.

In the present system, either three or five states of the modular scaler are selected as acceptable. These are the LOF corresponding to the desired channel number and the two or four immediately adjacent states. Reference to the drawings and description of the Tanaka patent will show a displacement of $\frac{1}{2}$ of an LOF count in the window probability diagram. This resulted from using 50% duty cycle square wave LOF pulses for the channel counters. In the present embodiment the enabling pulses activate the J and K terminals of the first flip flop of the channel counters producing an effect equivalent to using short duty cycle LOF pulses in the Tanaka patent system. Thus, the window probability diagram is centered on integral LOF numbers. This feature also is not part of the present invention, however.

In the continuous counting, single frequency mode an exact count of LOF pulses is always obtained. When one residue is selected in this mode, the system tunes to the LOF which satisfies the units and tens counters, and the selected modular scaler residue. Thus, it tunes to a single frequency, and hence the origin of the mode name. By selecting three or five residues when the counters are operating on an asynchronous sampling basis, the inherent count ambiguity (see Tanaka patent) establishes a 2MHz or 4 MHz window, respectively, of acceptable frequencies about the LOF frequency corresponding to the channel number.

As mentioned before, when the system is tuned within the restrictive frequency range determined by the selected-acceptable residues from the modular scaler it is, in a manner of speaking, "at rest" in a "quiet space." Any adjustments to tuning voltage necessitated by received signal deviation within the window are compensated by the AFC. If tuning should go outside the window for any reason, the tuning cycle control is activated to return the system to its single frequency mode. After the allotted time for single frequency operation, the system again reverts to its normal tuning window mode with AFC control restored.

Those skilled in the art will recognize that tuning adjustments in this system are made differently from those in the Tanaka patent. In the patented system, the tuning voltage source was operated directly from the channel number comparator, which produced ramp "up", "down" or "equal" signals, to maintain system tuning within the window. In the present system, the channel number comparator produces an equality pulse for the phase comparator and the phase comparator produces the ramp control voltage for the tuning voltage source. (The channel number comparator also sends either an equality or inequality pulse to the tuning cycle control.) Thus the channel number comparator doesn't directly control the tuning voltage source.

The Tanaka patent teaches how to change the window width. The present invention system features a switch-selectable window width. For modular 6 counting, for example, three or five residues may be chosen to produce a window 2 or 4 MHz wide centered about the frequency corresponding to the selected channel number. It is clear that by varying the counting modulus and the number of acceptable residues, that many different windows widths may be obtained. As mentioned above, the window in the Tanaka patent may also be offset by varying the duty cycle of the LOF pulses.

DETAILED DESCRIPTION

FIG. 1 is a block diagram of the tuning system constructed in accordance with the invention. A channel number generator 20 includes means for generating a desired two digit channel number for tuning the system. Number generator 20 may include encoding circuitry for producing special binary representations of the channel number in the tuning system and has means for producing a channel change initiate (CCI) signal in response to a channel number input. The generator is coupled to a channel number latch 22, which temporarily stores the input information, and to a turning cycle control 26 for sequencing the system through its tuning modes.

Number generator 20 may include a keyboard, or a memory system for generating preselected numbers upon command—either locally or by remote control. A particularly attractive system is described and claimed in copending application Ser. No. 621,911 filed 10-14-75, now U.S. Pat. No. 4,023,107 issued 5-10-77, in the name of Akio Tanaka in which a simple number generator is used with an "82×1" memory programmed with simple "stop or go" information. Such a memory is programmed by the user to sequentially produce whatever channel numbers are desired.

Tuning cycle control 26 is coupled to a ramp control 35, a phase comparator 40, a tuning voltage source 36, an AFC defeat 38, a counting logic 42, and a channel number comparator 56. A timing signal from clock 24 is supplied to tuning cycle control 26. The dashed lines between the tuning cycle control, phase comparator and counting logic indicate Ep and DEp signal lines which may be eliminated in the simplified FIG. 8A version of the tuning cycle control. A source of AFC voltage 39 is coupled between AFC defeat 38 and the tuning voltage source 36 which is also supplied from ramp control 35. Tuning voltage source 36 supplies DC tuning voltages for the local oscillator, mixer and amplifier stage (all not shown) in a tuner 44.

A clock 45 drives counting logic 42, which is coupled to phase comparator 40, a modular scaler 48, a counter preset 47, and channel number comparator 56. Tuner 44 is coupled to a LOF scaler 46 which is in turn coupled to modular scaler 48 and channel number comparator 56. Scaler 48 drives a units counter 40, which drives a tens counter 52, which in turn drives an overflow detector 54. The modular scaler, units and tens counters and overflow detector are often referred to as the channel number counters or LOF counters. Each of scaler 48, units counter 50, tens counter 52 and overflow detector 54 is coupled to channel number comparator 56 and counter preset 47. Channel number latch 22 is coupled to channel number comparator 56, to a decode display device 58 and to a band decoder 59. Band decoder 59 is coupled to counter preset 47 and tuner 44 and supplies presets to the counters based upon the frequency range of the signal corresponding to the selected channel number. Lastly a simple window selector 32 is coupled to channel number comparator 56.

The local oscillator frequency of the tuner is divided down by scalers 46 and 48, and counters 50 and 52 to derive the channel number corresponding to system tuning. The information is supplied to the channel number comparator for comparison with the desired channel number from the channel number latch. Any input of a desired channel number initiates a tuning cycle.

Clock 45 supplies timing pulses to counting logic circuit 42 for establishing the timing intervals for asynchronous sampling and provides a reference frequency signal for the phase comparator during the single frequency tuning mode. In this mode, the counters count LOF pulses and are reset each time channel number comparator 56 indicates equality between the derived and desired channel numbers. Each time equality is determined an equality pulse is supplied to phase comparator 40 which compares them for phase and frequency coincidence with timing pulses from counting logic 42. Depending upon the result of the phase comparison, ramp control 35 operates on the tuning voltage source to drive tuner 44 in an appropriate direction to minimize the phase comparator error. Single frequency tuning is accomplished by determining one residue of the modular scaler, which in conjunction with the units and tens counters registers equality at only one frequency. In the actual embodiment the system is tuned at "full speed" until an "overshoot" condition has been detected indicating the correct tuning position has been passed. Then a fixed time period is allocated for operation of the phase lock loop. This time period is determined by clock 24, operating through tuning cycle 26, which controls tuning sequencing.

After the predetermined time allocated for the signle frequency mode PLL has elapsed, counting logic circuit 42 reconfigures the counters for asynchronous sampling counting to produce the tuning window mode. The AFC is also enabled in this mode. In the tuning window mode timing circuits establish separate count, compare and reset intervals.

In the tuning window mode, a derived channel number is supplied to comparator 56 on a sample basis where it is compared with the desired channel number from latch 22 during a "compare" interval. The Inequality pulse (IEp) output of channel number comparator 56 is supplied to tuning cycle control during the "compare" interval. As long as the channel number comparator indicates that the tuning frequency is within the window, the system stays in the tuning window mode. During each reset interval the counters are loaded with their preset information in preparation for the next count interval.

AFC 39 is enabled in the tuning window mode, through defeat logic 38, to operate normally; tracking the received signal and maintaining system tuning by supplying any required correction voltage to tuning voltage source 36. If system tuning goes outside of the window, an inequality pulse is sent to tuning cycle control 26 to reinitiate the single frequency tuning mode as though a new channel number input had been made.

CHANNEL NUMBER LATCH 22 AND BAND DECODER 59 (FIG. 2)

Referring to FIG. 2, channel number latch 22 comprises a units latch 62 and a tens latch 64 which together provide temporary storage of a desired binary encoded channel number. Four signals, $U_A'$, $U_B'$, $U_C'$, $U_D'$ are coupled to units latch 62 and four signals $T_A'$, $T_B'$, $T_C'$ and $T_D'$ are coupled to tens latch 64. These eight signals are derived from the channel number generator and comprise a standard binary encoding of a two-digit channel number. Also coupled to the units and tens latches is a "load" signal from the number generator for controlling entry of the binary information into channel number latch 22.

Band decoder 58 functions to determine the appropriate presets for the channel counters based upon the channel number and its associated frequency band. The interconnected NAND and NOR gates, comprising the band decoder circuitry, receive the binary encoder channel number from latches 62 and 64 and supply appropriate preset information to counter preset 47. Tuner 44 is also supplied a signal from the band decoder for appropriately conditioning the tuner for tuning in the UHF or VHF frequency bands.

The outputs of units latch 62 and tens latch 64 include both the binary encoded selected channel number and its binary complements. The unaltered units signals are supplied to channel number comparator 56 (FIG. 6) to decode display 58 (FIG. 1) and to band decoder 59. Additionally, the unaltered $T_A'$ signal and the binary complements are supplied to the band decoder. $\overline{U_A'}$ is applied to one input of a NAND 62 and $\overline{U_B'}$ to one input of a NAND 64. $\overline{U_C'}$ and $\overline{U_D'}$ are applied to both inputs of a NAND 66, the output of which is coupled to a first input of a NOR 68 and through an Inverter 69 to a first input each of a NOR 76 and a NAND 80.

$\overline{T_A'}$ is applied to a second input of NOR 68, a first input of a NOR 74 and a first input of a NOR 78, $\overline{T_B'}$, $\overline{T_C'}$, and $\overline{T_D}$ are applied to separate inputs of a three input NAND 70. $\overline{T_D'}$ is also coupled to a third input of NOR 68, a second input of NOR 78 and a second input of NOR 76. $UB'$ is applied to the fourth input of NOR 68. $T_A'$ is applied to a first input of a NOR 72 and to the third input of NOR 76. $U_A'$ is coupled to a first input of a NAND 82 and a second input of NAND 64, $U_B'$ to a second input each of NAND's 62 and 82, $U_C'$ to a third input each of NAND's 62, 64 and 82 and $U_D'$ to a first input of a NAND 84.

NOR 68 supplies a first input of a NOR 86. NAND 70 supplies the second input each of NOR's 72 and 74. The output of NOR 74 is coupled to the second input of NAND 80. The output of NOR 76 is coupled to the second input of NOR 86 and to a first input of a NOR 88. The output of NOR 78 is coupled to the second input of NOR 88.

The output of NOR 72 is coupled to the fourth input each of NAND's 62, 64 and 82, the second input of NAND 84 and, through an Inverter 90, the first input of a NAND 96. NAND's 62 and 64 supply a first and a second input of a NAND 92 and NAND's 82 and 84 supply a first and a second input of a NAND 94. The output of NOR 86 is coupled to a second input of NAND 96 and the third input of NAND 92. The output of NOR 88 is coupled to the third input of NAND 94. NAND 80 is coupled to the third input of NAND 96 and to the fourth input of NAND 94. Signal $B_Z$ is at the output of NAND 92, $B_Y$ at the output of NAND 94 and $B_X$ at the output of NAND 96. NAND 94 is coupled to an Inverter 98 producing $\overline{B_Y}$ at its output. NAND 96 is coupled to an Inverter 100, developing $\overline{B_X}$ at its output.

Signals $B_X$ and $B_Y$ are applied to the two inputs of an OR 102, producing a U/V signal at its output. $\overline{B_X}$ and $B_Y$ are applied to the two inputs of an OR 104, producing a signal $B_{SH}$ at its output.($\overline{B_Y}$ is also called $B_{SS}$.) The output of NAND 92 is a signal $B_Z$ which, together with $B_X$ and $B_Y$ and their inversions, is supplied to counter preset 47.

The described latches, or temporary storage memories, are well known in the art and a CMOS implementation thereof suitable for use in the preferred embodiment of the invention is RCA type CD 4042.

FIG. 3 is a table of the various logic signals for groups of channel number inputs. $B_X$, $B_Y$ (and their complements) and $B_Z$ enable loading of the proper presets into channel counters 48, 50, 52 and 54. $B_{SH}$ and U/V provide well-known band switch information for high and low VHF and UHF tuning bands. The $B_{SS}$ signal is used for bandswitching of the VHF frequency channels numbers 84–99. These numbers may be used in the future and the tuning system may be readily adapted for operation with them.

COUNTER PRESET 47 AND CHANNEL COUNTERS 48, 50, 52 AND 54 (FIG. 4)

Counter preset 47 supplies the appropriate set or reset terminals of the flip flops in the channel counters. It accepts encoding signals from band decoder 59 and forces the appropriate preset count values for each of the several tuning bands into the counters. As is fully detailed in the Tanaka patent, the presets are arranged such that the number of LOF pulses counted corresponds to the channel number corresponding to the frequency to which the tuner is tuned.

Figures 4, 5:
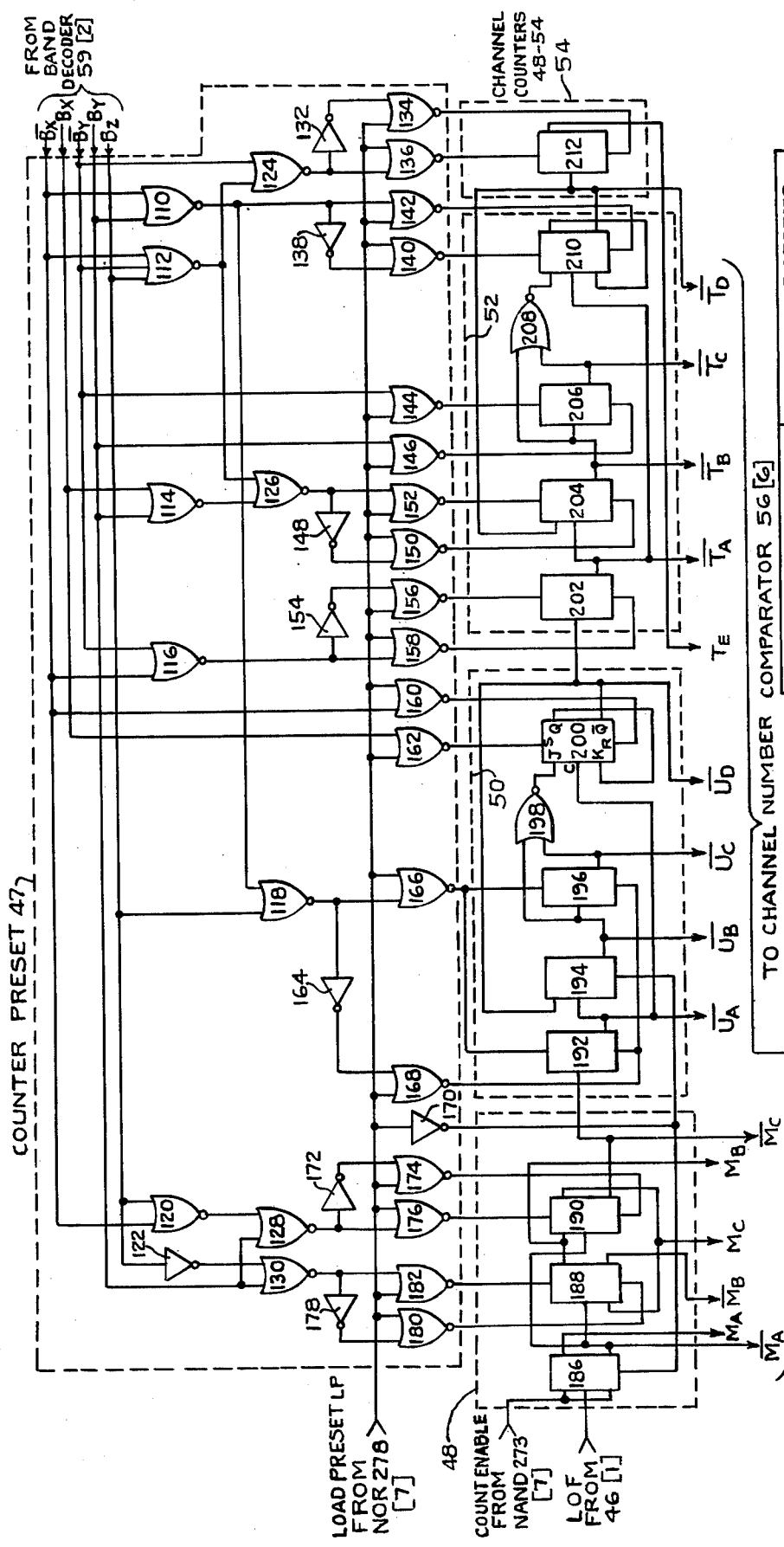
FIG. 4 is the detail logic circuit of counter preset 47 and the channel counters including modular scaler 48, units counter 50, tens counter 52, and overflow detector 54.
FIG. 5 is a table of logic signals for counter preset

The table of FIG. 5 shows the basic band decoded signals BX, BY, BZ for channel number inputs and lists the presets for overflow detector 54, tens counter 52, units counter 50 and modular scaler 48. The presets are in decimal notation although they are loaded into the counters in binary form.

The LOF scaler is shown in block form since it is well known in the art. In particular, reference may be made to the previously mentioned Tanaka patent. Briefly, the local oscillator frequency is divided by 1024 in the LOF scaler. The divided or scaled LOF output is supplied to a series of interconnected flip flops arranged to perform successive division operations to derive the channel number. Each of the counters is serially connected so that the output of each set of flip flops is the input of the next set of flip flops, forming a familiar counter chain.

Because of the 6 MHz spacing between adjacent TV channels, (i.e., between the picture carriers of adjacent channels), within each of the four discontinuous television frequency bands, modular six arithmetic becomes of particular significance since a complete cycling of the modular scaler corresponds to a 6 MHz change in LOF and each state thus represents a 1 MHz interval.

In the preferred embodiment, modular scaler 48 changes state for each 1 MHz change in oscillator frequency. Proper selection of its presets for each band enables its state to consistently reflect incremental tuning within each channel throughout the tuning spectrum. The modular scaler information is supplied as incremental additions to the units counter and adds to its preset count. Similarly, cycling of the units counter drives the tens counter, adding to its preset. The channel number corresponding to system tuning is in the channel number latch in binary form and a visible readout may be readily presented to the viewer.

In more detail, modular scaler 48 is interconnected to provide six states (base 6) counting. Counter 50 provides units counting, counter 52, tens counting and 54 providing 00 detection. The counting states (residues) of modular counter 48 are shown in FIG. 12 with its three principlal output signals $M_A$, $M_B$ and $M_C$.

Counter preset 47 includes a plurality of NOR's and Inverters. Signal $\overline{B_X}$ from the band decoder is applied to a first input each of NOR's 110, 112, 116, 160 and 120. $B_X$ is applied to a first input each of NOR's 114 and 162. Signal $\overline{B_Y}$ is applied to a first input each of a NOR 124, a NOR 144 and to a second input each of NOR 112 and NOR 116. $B_Y$ is applied to the second input of a NOR 110, a first input of NOR 146, the second input of NOR 114 and to a first input each of a NOR 128 and a NOR 130. $B_Z$ is applied to the third input of NOR 112, a first input of a NOR 118, the second input of NOR 120 and through an Inverter 122, to the second input of NOR 130.

NOR 110 is coupled to a first input of a NOR 142, through an Inverter 138, to a first input of a NOR 140 and to the second input of NOR 118. NOR 112 is coupled to the second input of NOR 124 and to a first input of a NOR 126. NOR 114 supplies the second input of NOR 126. NOR 116 supplies a first input of a NOR 158 and, through an Inverter 154, the first input of a NOR 156. NOR 118 is coupled to a first input of a NOR 166 and, through an Inverter 164, to a first input of a NOR 168. NOR 126 is coupled to a first input of a NOR 152 and, through an Inverter 148, to a first input of a NOR 150. NOR 124 is coupled to a first input of a NOR 136 and, through an Inverter 132, to a first input of a NOR 134.

NOR 120 supplies the second input of NOR 128. NOR 128, in turn, supplies a first input of a NOR 176 and, through an Inverter 172, a first input of a NOR 174. Similarly NOR 130 supplies a first input of a NOR 182 and, through an Inverter 178, a first input of a NOR 180. The load preset signal LP from NOR 278 (FIG. 7) is coupled to the second input each of NOR's 134, 136, 140, 142, 144, 146, 150, 152, 156, 158, 160, 162, 166, 168, 174, 176, 180, 182 and to Inverter 170.

Modular scaler 48 comprises three flip flops (FF's) arranged for base 6 counting. The count enable signal from counting logic NAND 273 (FIG. 7) is coupled to J, K of FF 186. (For clarity terminal designations have been omitted from all FF's but FF 200 in counter 50.) $M_A$ is taken from Q of FF 186. $\overline{Q}$ is coupled to clock terminal C of FF 188 and to C of FF 190. $M_A$ is taken from $\overline{Q}$ of FF 186. Q of FF 188 is coupled to J of FF 190 and carries signal $M_B$. $\overline{M_B}$ appears at $\overline{Q}$ of FF 188. Q of FF 190 is coupled to K of FF 188 and carries signal $M_C$. $\overline{Q}$ of FF 190, is coupled to C of FF 192 in units counter 50 and carries signal $\overline{M_C}$.

NOR 180 is coupled to reset terminal R of FF 188. Similarly, NOR 182 is coupled to set terminal S of FF 188, NOR 176 to S of FF 190 and NOR 174 to R of FF 190. Inverter 170 supplies R of FF 186 in scaler 48 and R of FF 194 in units counter 50.

$\overline{Q}$ of FF 192 is connected to C of FF's 194 and 200 and carries signal $\overline{U_A}$. $\overline{Q}$ of FF 194 is coupled to C of FF 196, to a first input of a NOR 198 and carries signal $\overline{U_B}$. $\overline{Q}$ of FF 196 supplies the second input of NOR 198 and carries signal $\overline{U_C}$. NOR 198 is coupled to J of FF 200. Q and K of FF 200 are connected together; $\overline{Q}$ is connected to J of FF 194, C of FF 202 in the tens counter and carries signal $\overline{U_B}$.

NOR 168 is coupled to R of FF's of 192 and 196; NOR 166 is connected to S of FF's 192 and 196; NOR 162 to S of FF 200; and NOR 160 to R of FF 200. $\overline{Q}$ of FF 202 is coupled to C of FF 204 and FF 210 and carries signal $\overline{T_A}$. $\overline{Q}$ of FF 204 is coupled to C of FF 206, to a first input of a NOR 208 and carries signal $\overline{T_B}$. $\overline{Q}$ of FF 206 is coupled to the second input of NOR 208 and carries signal $\overline{T_C}$. The output of NOR 208 is coupled to J of FF 210. Its Q and K terminals are connected together. $\overline{Q}$ of 210 is connected back to J of FF 204 and to C of FF 212 in the overflow detector and carries a signal $\overline{T_D}$.

NOR's 156 and 158 are connected to S and R of FF 202, respectively. Similarly, NOR's 150 and 152 are coupled, respectively, to R and S of FF 204, NOR's 144 and 146 to S and R of FF 206, respectively and NOR's 140 and 142 to S and R of FF 210, respectively. NOR's 134 and 136 are coupled, respectively to R and S of FF 212 in overflow detector 54. Q of FF 212 carries a signal $T_E$.

As mentioned, the gates in counter preset 47 are interconnected to decode band decode signals $B_X$, $B_Y$, and $B_Z$ (and their complements) and develop the binary presets for loading the counters. When load preset signal LP at the output of NOR 278 goes to 0, counter preset 47 loads modular scaler 48, units counter 50, tens counter 52, and overflow detector 54 in accordance with the band decoder signals.

Units counter 50 represents the units of the derived channel number. The four flip flops of the units counter provide decode because of NOR 198. Similarly, tens counter 52, which develops the binary representation of the tens digit of the derived channel number provides decode counting because of NOR 208.

Overflow detector 54 assures that a 99 to 00 transition occurs in the counters for channels 2–83. This transition changes $T_D$ from 1 to 0 ($\overline{T_D}$ goes from 0 to 1) which causes FF 212 to change state, driving $T_E$ from 1 to 0. Reference to FIG. 5 shows that with the presets used the counters must go through a 99 to 00 transition for all VHF and UHF frequencies. Since overflow detector 54 is preset to its 1 state, it flips to a 0 state when a 99 to 00 transition occurs. Channels 84 through 99 are in reality VHF channels. Their frequencies are low enough, that in conjunction with the presets there is no need for the 99 to 00 transition. Consequently, FF 212 is preset to 0 for these channels.

CHANNEL NUMBER COMPARATOR (FIG. 6)

Channel number comparator 56 compares the derived channel number; based upon the LOF, with the desired channel number from the channel number latch. When in the tuning window mode, a non-equality signal from the channel number comparator during the compare interval results in reinitiation of the single frequency mode. It determines equality between the tens and units digits of the received and desired channel numbers and if the residue of the modular scaler is among the predetermined acceptable ones. It also includes circuitry, (RS FF 255) for guarding against an erroneous comparison signal based upon an indeterminate condition which could occur during mode changing.

Comparator 56 includes a series of EXCLUSIVE OR's 220–236 in its units and tens sections. Signals $T_A'$, $\overline{T_A}$, $T_B'$, $\overline{T_B}$, $T_C'$ $\overline{T_C}$, and $T_D'$, $\overline{T_D}$ are applied respectively to the inputs of Ex OR's 226, 224, 222 and 220. Their outputs supply a NAND 228 whose output is coupled to a first input of a NOR 240. Similarly, units signals $\overline{U_A}$, $U_A'$ etc., are supplied to OR's 230 . . . 236, which drive a NAND 238 having its output connected to a second input of NOR 240. Signal $T_E$ is applied to the third input of NOR 240.

NOR 240 is coupled to a first input of a NAND 242 and to one input of a NAND 256. $M_B$ and $\overline{M_C}$ are coupled to the remaining inputs of NAND 242. NAND 242 is supplied to one input of a NOR 280. $\overline{M_A}$ is applied to a second input of NOR 280 and $\overline{M_A}$ and $M_A$ are applied to first inputs of a NAND 248 and a NAND 244, respectively. Mode identification signal MIS from the tuning cycle control is supplied to the last input of NOR 280. The output of NOR 280 is the equality pulse. However, the pulse may be very narrow. To stretch the pulse to assure reliable resetting of the counters. an RS FF 285 is provided.

RS FF 285 includes cross coupled NOR's 282 and 286, with the input of NOR 282 being supplied from NOR 280. The output of the RS FF is labelled Ep (equality pulse) and is supplied to the counting logic, tuning cycle control and phase comparator. The other input of RS FF 285 is the LOF pulse, through an Inverter 284. This has the effect of triggering and resetting the FF from 280 and 284 which assures synchronized Ep pulses of the same width as the LOF pulses.

$\overline{M_B}$ is coupled to the second input of NAND 248 and to a first input of NAND 246, and $M_C$ is applied to the second input of NAND 244. The S.P.D.T. switch in window selector 32 is connected to the remaining inputs of NAND's 244 and 246. NAND's 244, 246 and 248 supply the remaining inputs of NAND 56 whose output is coupled to a first input of a NAND 258. Compare interval timing signal $\phi_1$ is applied to a second input of NAND 258.

Reset timing signal $\phi_2$ is applied to a first input of a NOR 250, its second input being supplied with an inverted MIS signal, by virtue of Inverter 249. NOR 250 supplies a first input of a NOR 252, which is cross connected with a NOR 254 to form an RS flip flop 255. The inverted MIS signal is applied to NOR 254 in RS flip flop 255. The output of the RS flip flop is coupled to the last input of NAND 258. The output of NAND 258 constitutes the Inequality pulse IEp which is supplied to the tuning cycle control.

One input to each EXCLUSIVE OR is inverted and therefore its output is at 1 when equality exists in the compared signals. When all EXCLUSIVE OR's in a digit section indicate equality in the compared signals, all inputs to the associated NAND are proper for it to change state. Thus when all four bits of the binary representation of the received channel number tens digit match the four bits of the desired channel number tens digit, all inputs of NAND 228 are at 1 and its output is at 0. Similarly, when the units digit Ex OR's indicate equality, the inputs of NAND 238 are all at 1 and its output is at 0. NOR 240 enables NAND 242 only when the units and tens sections indicate a match and the 00-99 transition $T_E$ is at 0. The last section of channel number comparator 56 determines if the state of modular scaler 48 is acceptable.

In FIG. 12, the six states of scaler 48 are shown. For a 4 MHz wide window about the frequency corresponding to the channel number, the 0 state is unacceptable and the remaining states, 1 through 5 are acceptable. Acceptance of states 2, 3 and 4 and rejection of states 0, 1, and 5, provides a window width of 2 MHz. This is simply carried out by a single pole switch and voltage sources $+5$ V and $-12$ V in window selector 32.

NAND gates 244, 246 and 248 detect the unwanted states of scaler 48. Their outputs and that of NOR 240, which indicates an unacceptable condition for the units, tens and overflow counters, supply NAND 256. Its output is combined with the compare interval timing signal $\overline{\phi_1}$ the reset timing interval signal $\phi_2$ and the MIS signal in NAND 258. RS FF 255 obviates generation of an erroneous comparison signal based upon an indeterminate count in the comparator when switching over from one mode to the other. Upon occurrence of a MIS signal, calling for a tuning cycle change, the reset pulse $\phi_2$ locks up RS FF 255 in a state which inhibits NAND 258. This assures completion of a full count cycle before the channel number comparator is interrogated and guards against a false inequality pulse.

COUNTING LOGIC 42 (FIG. 7)

Counting logic 42 comprises a series of interconnected flip flops producing timing pulses for the tuning system. It is driven by a 2 MHz clock 45 and, by successive division, develops various timing pulses. The signal at $Q_F$ establishes a fixed reference frequency for phase comparator 40. The $\phi_2$ timing pulse resets the LOF counters in the tuning window mode. The signal at $Q_G$, operating through NAND 273 and in conjunction with the MIS signal, establishes the count interval for asynchronous sampling to establish the window. $\overline{\phi_1}$ establishes the compare interval. LP at the output of NOR 278 enables of NOR gates in counter preset 47 to permit loading of the preset information into the LOF counters and the output of NAND 273 supplies the count enable pulse.

A 2 MHz pulse train from clock 45 drives a divide-by-32 counter 262. The output of the counter is supplied to the clock terminal of a divide-by-128 counter 264. Both counters may consist of suitably interconnected flip flops. A signal DEp (divided-down-equality pulse) is coupled to the reset terminals of counters 262 and 264.

$Q_D$, $Q_E$, $Q_F$ and $Q_G$ of counter 264 represent outputs corresponding respectively to the input being divided by 16, 32, 64 and 128. $Q_D$ is coupled to a first input of a NAND 266; $Q_E$ to a first input of a NAND 270 and through an Inverter 268 to a second input of NAND 266; $Q_F$ to a third input of NAND 266 and to a first input of a NOR 272; and $Q_G$ to the fourth input of NAND 266, the second input of NAND 270 and a first input of a NAND 273 NAND 270 is coupled to the second input of NOR 272 whose output determines signal $\overline{\phi_1}$. NAND 266 is coupled to the first input of a NOR 274 and develops signal $\phi_2$. $Q_F$ supplies the 1 KHz reference for phase detector 40 in FIG. 9.

The mode identification signal (MIS) from the tuning cycle control in FIG. 8 is supplied to the second input of NAND 273, and through an Inverter 276 to the second input of NOR 274. NOR 274 supplies one input of a NOR 278, the other input being supplied an Ep pulse through an Inverter 277. The output of NAND 278 is the load preset signal LP.

TUNING CYCLE CONTROL 26 (FIG. 8)

Tuning cycle control 26 determines the operational sequencing of the system in response to either a CCI signal upon entry of a channel number or an IEp signal indicating that system tuning is outside the range defined by the window. Essentially the tuning cycle control is a plurality of flip flops interconnected as a counter whose states provide various tuning intervals developed from clock 24. As mentioned earlier the tuning cycle control may be greatly simplified if one either relaxes the channel acquisition time or uses a faster tuning voltage source.

The design criterion of 200 ms maximum channel acquisition time led to the development illustrated in FIG. 8. This circuit implementation was of relatively slow P-MOS technology. With faster semiconductor technology such as C-MOS a higher comparison frequency may be used, obviating the added complexity of the tuning cycle control. For completeness, both the complex and simple versions are illustrated and will be described, beginning with the actual form in FIG. 8. Similarly numbered elements in each of FIGS. 8 and 8A perform similar functions.

The complications result from the need to initially obtain ramp direction information from the phase comparator, while inhibiting PLL operation, drive the ramp at full speed until an "overshoot" condition is detected and then to let the PLL operate for a sufficient time to assure single frequency tuning. The ramp drive is essentially latched up in one direction until the correct frequency has been passed—which indicates system tuning is close to the desired frequency. Then the PLL is enabled and allowed to operate for the remainder of the allotted time period before the system is released to its tuning window mode. (It may be noted that the terms "full ramp" or "100% ramping" refers to supplying a continuous (D.C.) ramp control voltage. In normal operation, the phase comparator delivers a serrated ramp control voltage with a relatively low duty cycle).

Clock 24 supplies 60 Hz to a first input of a NAND 290, its other input being enabled from the output of an RS FF 325. Ramp control voltages from the phase comparator NAND's 342 and 346 (FIG. 9) are supplied respectively, to the inputs of a NAND 348, a first input each of NOR's 368, 370, 388, 394 and directly, and though a delay, to first and second inputs each of NOR's 352 and 350. An Inverter 387 supplies the last inputs of NOR's 388 and 394. An Inverter 366 supplies the remaining inputs of NOR's 368 and 370, which in turn supply an RS FF 375 comprising cross connected NOR's 372 and 374. An Inverter 380 is coupled to the remaining inputs of NOR's 382, 384 and 350 and 352. The outputs of NOR's 384 and 388 and of NOR's 382 and 394, respectively supply the inputs of NOR's 386 and 396, the outputs of which supply the $R_U$ and $R_D$ signals. NOR's 350 and 352 supply both inputs of a NOR 354.

The output of NOR 354 is coupled to a first input of NAND 296. The output of NAND 348 is coupled to an input of a NAND 292. The outputs of NAND's 290 and 292 are coupled, respectively, to second and third inputs of a NAND 296, its last input being supplied from a NAND 294. NAND 296 drives FF 298 in counter 301. Q of FF 298 is coupled to a first input of a NOR 310 and $\overline{Q}$ to a first input of NOR's 312 and 314 and C of FF 300. Q of FF 300 is coupled to a second input of NOR 312, and $\overline{Q}$ to a second input of NOR 314 and to C of FF 302.

Q of FF 302 supplies a first input of a NOR 320, Q supplies C of FF 304 and a first input of a NAND 316 and a NOR 318. Q of FF 304 is coupled to second inputs of NOR's 318 and 320. Q of FF 304 is coupled to C of FF 306 and to a second input of NAND 316. Q of FF 306 is coupled to the third inputs of NOR 318, and $\overline{Q}$ is coupled to third inputs each of NOR 320 and NAND 316. The reset terminals of FF's 298, 300, 304, and 306 and a first input of a NOR 324 are coupled to the output of a NAND 308 having an IEp signal input from channel number comparator NAND 258 (FIG. 6) and a CCI signal from channel number generator 20 (FIG. 1).

The output of NOR 320 carries the MIS signal and is coupled to a first input of a NOR 326 and to a second input of a NOR 324 and to a number of inverters in the other Figures. NOR 318 supplies a first input of a NOR 322, which is cross coupled with NOR 324 to form an RS flip flop 325, which is coupled to a second input of NOR 326, a second input of NAND 290 and to inverter 387. NAND 316 supplies the remaining inputs of NOR's 310, 312, and 314. NOR 312 is coupled to a second input of NAND 292 and to inverter 366. NOR 310 is coupled to a first input of NAND 294. Ep is supplied directly, and via a flip flop 328, to the remaining inputs of NOR 326, the DEp output of which is coupled to the last input of NAND 294.

NOR's 350, 352 and 354 provide the "overshoot" detection function for indicating when system tuning has passed the desired point during full ramping. NOR's 368 and 370, in conjunction with RS FF 375 provide the mechanism driving the ramp fully in the desired direction. NOR's 382 and 384 override the normal ramp control signal NOR's 388 and 394, when in full ramping. RS FF 325 disables NOR's 388 and 394 as counter 301 is advanced from its state 4 to state 15 to carry out the full ramping operations. NAND 316 and NOR 318 are decoders for the counter states, NOR's 310, 312 and 314 direct counter state changes and NAND's 290-296 perform the changes. NOR 320 produces the MIS signal based upon the states of FF's 302-306 in the counter which is timed from the 0 state to state 15 of counter 301.

The counter flip flops have a total of 32 states, with state 0 being the reset. NOR 310 is a 0 state detector and enables NAND 294. During this state the DEp pulse resets the counters in counting logic 42, resets the phase comparator and advances counter 301 from 0 to state 1.

NOR 312 detects state 1 and enables NAND 292 to subsequently advance the counter to state 2 and, through inverter 366, enables directional NOR's 368 and 370 causing appropriate setting of RS FF 375 to supply full ramp control voltage. The ramp correction direction information is received from the phase comparator. In state 2, NOR 310 again enables NAND 294. The DEp signal is again produced, resetting the counting logic and the phase comparator and advancing counter 301 to state 3.

NOR 314 detects state 3 of counter 301 and enables the ramp override NOR's 382 and 384 and the overshoot detection NOR's 350 and 352 to generate full ramp tuning voltage and to detect passing the correct numbers in the channel number comparator, which indicates system tuning has gone beyond the desired frequency. When this occurs, counter 301 is advanced to state 4 by NOR 354 activating NAND 296.

NOR 318 detects state 4 and sets RS FF 325 to maintain NAND 290 enabled for counting and for enabling the normal ramp control signal NOR's 388 and 394. Counter 301 is advanced from state 4 to state 16 by the 60 Hz pulses from clock 24, providing an approximate 200 ms period during which PLL single frequency tuning is accomplished. The period is sufficiently long to bring the system to the frequency corresponding to any FCC allocated channel. When state 16 is reached, counter 301 is latched by NOR 320 acting through RS FF 325.

In FIG. 8A the simplified version of tuning control 26 is shown. Here the system operates either in its single frequency mode or its tuning window mode—there is no provision for full ramping in the single frequency mode. Therefore, when in the single frequency mode, the phase comparator in the PLL supplies ramp correction signals, during the states 0-11 of counter 301. At state 12 the MIS signal is produced. The DEp signal is not required and all leads bearing this signal should be grounded. The Equality pulse Ep is not used in this version of tuning control 26 (It is still used in the system however). NOR's 324, 386, 396 and NAND 296 are retained but merely function as Inverters to make the signal polarities correct.

NAND 308 sets the flip flops in the counter to 0 upon occurrence of a channel change initiate (CCI) signal or an Inequality Pulse (IEp) signal indicating system tuning is outside the window. Flip flops 302, 304 and 306 result in NAND 320 producing the MIS signal which simultaneously: enables NAND 290 to allow the counter to begin counting; enables the ramp control NAND's 388 and 394 (which receive ramp directional information from the phase comparator); defeats the AFC; and enables the circuitry in the channel comparator for preventing a comparison signal during a mode change. The channel counters count for 200 ms at which time NOR 320 changes state at its output, removing the MIS signal and inhibiting further counting. It should be readily apparent that extreme simplification is thus made possible by either relaxing the requirement on maximum channel acquisition time or using faster semiconductor technology for speeding up the system.

PHASE COMPARATOR 40 (FIG. 9)

The phase comparator determines whether the LOF is above or below the desired frequency. The timing signal of counting logic counter is a 1 KHz fixed frequency pulse train which is used as the phase comparator reference frequency. Its other input is the Ep signal which is a series of pulses produced by the channel number comparator indicating equality between the desired channel number and derived channel number. As described, while the phase comparator continues to operate, the PLL is inhibited during the tuning window mode and during full ramping. The phase comparator itself is well-known in the art; one manufactured by Motorola under designation MC4044 is logically equivalent, although the voltage levels are not correct.

The $Q_F$ output of counting logic counter 264 (FIG. 7) is coupled to a first input of a NAND 330, the output of which connects to a first input each of NAND's 342 and 344 and the input of an RS FF 335 comprising cross coupled NAND's 332 and 334. Signal Ep from the channel number comparator (FIG. 6) is coupled to a first input of a NAND 340, the output of which is coupled to a first input of a NAND 346, a second input of NAND 344 and to the input of RS FF 337 comprising cross connected NAND's 336 and 338. Signal DEp is coupled through an Inverter 333 to a second input each of NAND's 334 and 336.

The output of RS FF 337 is coupled to a second input of NAND 346 and to a third input of NAND 344. The output of RS FF 335 is coupled to a second input of NAND 342 and a fourth input of NAND 344. The output of NAND 344 is coupled to the remaining inputs of NAND's 334, 336, 342, and 346. NAND 346 is coupled to the last input of NAND 340 and NAND 342 to the last input of NAND 330. The outputs of NAND's 342 and 346 supply the ramp turn-on control signals to tuning cycle control 26 (FIG. 8). If the reference signal frequency is greater than Ep, NAND 342 sends a ramp signal to increase the tuning voltage; if lower, NAND 346 sends a ramp signal to lower the tuning voltage. The DEp signal resets the phase comparator so that it starts from the correct state. This precludes a false direction signal.

RAMP CONTROL 35 (FIG. 10)

Ramp control 35 operates in conjunction with a voltage divider circuit to adjust the LOF through tuning voltage source 36, and thereby change system tuning. The ramp control signal is directly dependent on the output of phase comparator 40 as made available to it by tuning cycle control 26. The ramp control is only active during the single frequency mode, a conventional AFC circuit making minor adjustments to the tuning voltage control during the tuning window mode. NOR's 386 and 396 from the tuning cycle control respectively supply the two inputs of a NAND 387 and, through Inverters 390 and 398 respectively supply the gate electrodes of FET's 392 and 393.

A source of +5 V is coupled to the source electrode of FET 393, and −12 V is coupled to the drain electrode of FET 392. The drain electrode of FET 393 and source electrode of FET 392 are coupled together and the ramp control signals $R_U/R_D$ taken from this junction and applied to the tuning voltage source in FIG. 11. The actual ramp control signal is taken from the common terminal of the two FET's and corresponds to $+V_1$ for a $R_D$ signal, $-V_2$ for a $R_U$ signal and an open circuit in its third state. The ramp signal is supplied to one input of an OTA in the tuning voltage source (FIG. 11) along with timing signal indicating occurrence of a ramp signal. Thus ramp control 35 appropriately enables tuning voltage source 36 when a $R_U$ or $R_D$ is produced.

TUNING VOLTAGE SOURCE 36 (FIG. 11)

The $R_U/R_D$ signal from the ramp control (FIG. 10) is coupled to a resistor divider consisting of a resistor 420 and a grounded resistor 423. Their junction is connected to terminal 2 of an operational transconductance amplifier (OTA) 422 functioning as a voltage controlled current source. RCA No. CA3080 is the actual OTA used. A −12 V source also is connected through resistors 442 and 424 to this terminal. A −5 V source is connected to the terminal 4 of OTA 422. A parallel combination of a resistor 464 and a capacitor 466, is connected between OTA terminals 4 and 5. Output terminal 6 supplies a grounded capacitor 460 connected in parallel with the series connection of a resistor 456 and a capacitor 458, and the gate of an FET 448. +30 V is connected to terminal 7 of OTA 422, to the source electrode 452 of FET 448 and through a resistor 474 to the junction of the anodes of a pair of diodes 470 and 472. The FET drain electrodes 450 is connected to ground through a resistor 462 and supplies the DC tuning voltage to the Tuner (FIG. 1). $\phi_C$ from the ramp control (FIG. 10) is supplied through a resistor 468 to the cathode of diode 464 and terminal 5 of OTA 422. The MIS signal from NOR 320 (FIG. 8) supplies the cathode of diode 472.

Voltage from AFC 39 (FIG. 1) is applied through a resistor 426 to the base 434 of a common-emitter transistor 428, which functions as a low pass buffer stage. Base 434 is coupled through series connected resistor 436 and capacitor 438 to a source of −12 V. Collector 432 is supplied with +5 V and emitter 430 is connected to −12 V through a resistor 440 and resistor 442. A resistor 444 is connected from their junction to terminal 3 of the OTA.

The tuning voltage source comprises an OTA for supplying appropriate current under control of ramp control 35. The AFC circuit is also coupled, through a buffer amplifier, to the OTA for exercising tuning voltage control during the tuning window mode. (The MIS signal controls defeat of the AFC during single frequency tuning mode.) Timing signal $\phi_C$ (derived from ramp control 35 in FIG. 9) enables the OTA when a $R_U/R_D$ signal is produced. During PLL operation the OTA function or a pulse width modulated sample and hold circuit and $\phi_C$ acts as a gating control for the sample and hold. During AFC operation OTA 422 is acting as a linear amplifier and is on all the time.

Referring briefly to FIG. 12, it will be recalled that modular scaler 48 consists of three interconnected flip flops having six states or residues, each of which corresponds to a 1 MHz fraction of the 6 MHz television channel. The three outputs of the scaler $M_A$, $M_B$, $M_C$ (which form the binary representation of the modulo scaler count) are shown for each state.

State 3 is the preselected residue which indicates tuning to the center of the 6 MHz wide band of frequencies corresponding to the channel number. Accepting residues 2, 3 and 4 provides a ±1 MHz window or restricted frequency region about the center frequency of the channel. Similarly, selection of additional residues for example 1–5 results in a window ±2 MHz in width.

What has been described is a novel tuning system having all of the benefits of a tuning window without the detriment of needing an AFC range that is wider than the window. The invention embraces a two-mode tuning system with an initial single frequency mode and a subsequent tuning window mode.

It is recognized that numerous changes or modifications may be made in the described invention without departing from its true scope and that the invention is to be limited only as defined in the claims.

What is claimed is:

1. The method of operating a television receiver for receiving any channel band in the television frequency spectrum comprising the steps of:
   selecting a desired channel band in said spectrum;
   operating said receiver in a first, single frequency tuning mode and initially tuning said receiver to a particular frequency within said selected channel band;
   operating said receiver in a second, window tuning mode and establishing a window defining a restricted range of frequencies about said particular frequency; and
   maintaining receiver tuning within said window.

2. The method of claim 1, wherein said receiver is returned to said first tuning mode and the steps beginning with initially tuning are repeated if tuning of said receiver goes outside said window.

3. The method of claim 2 wherein said initially tuning step includes the steps of:
   phase lock loop tuning said receiver to said particular frequency; and
   terminating phase lock loop tuning when establishing said window.

4. The method of claim 3, wherein said television receiver includes a tuner having a voltage-controllable variable frequency local oscillator, a modular counter deriving channel number information based upon said oscillator frequency, and wherein said phase lock loop tuning step includes the step of:
   operating said counter on a continuous basis.

5. The method of claim 4, wherein said counter is operated on an asynchronous sample basis for defining said window.

6. The method of claim 5, wherein said receiver includes a phase comparator and a source of reference frequency for phase lock loop tuning, and including the further steps of:
   generating a pulse each time derived channel number information matches the channel number information corresponding to said selected channel band; and
   comparing in the phase comparator the frequency and phase of the generated pulses with said reference frequency.

7. The method of claim 6, wherein said terminating step is performed a predetermined time after phase lock loop tuning is initiated.

8. The method of claim 7, wherein said receiver includes a channel number comparator for comparing derived and selected channel number information and wherein said counter includes a modular scaler having states corresponding to incremental tuning within each channel band, certain of said states being selected to define said window.

9. The method of claim 8 further including automatic frequency control means, and including the step of:
   disabling said automatic frequency control means during phase lock loop tuning.

10. The method of operating a television receiver for receiving any channel in the television frequency spectrum, wherein said receiver includes a tuner having a voltage controllable variable frequency local oscillator and a modular counter deriving channel numbers based upon said oscillator frequency, comprising the steps of:
    generating the number of a desired channel in said spectrum;
    phase lock loop tuning said receiver to the local oscillator frequency corresponding to the number of said desired channel by operating said modular counter on a continuous basis;
    terminating phase lock loop tuning while simultaneously establishing a window defining a restricted range of frequencies about said particular frequency by operating said modular counter on an asynchronous sample basis; and
    enabling an automatic frequency control for maintaining receiver tuning within said window.

11. The method of claim 10 wherein the steps beginning with phase lock loop tuning are repeated should tuning of said receiver go outside said window.

12. In an all-electronic, all-channel digital tuning system of the type for tuning to any television channel by its FCC-allocated channel number wherein; channel number counters are operated on a sample basis to derive system tuning based upon the local oscillator frequency; a channel number comparator compares derived channel numbers with selected, desired channel numbers for controlling the local oscillator frequency; a modular counter in the channel number counters includes residue states corresponding to intrachannel frequencies, and wherein the channel number comparator accepts more than one residue state of the modular counter to produce a restricted range or window of acceptable frequencies within each numbered channel, the improvement comprising:
    means for initially tuning said local oscillator to the frequency corresponding to the selected channel number and, when said oscillator is substantially tuned to said frequency, for subsequently releasing said local oscillator for operation within a window about said frequency.

13. The tuning system of claim 12 wherein said means for initially tuning is enabled whenever said channel number comparator indicates an out-of-window tuning condition.

14. The tuning system of claim 13 wherein said means for initially tuning comprise a phase lock loop utilizing said channel number counters on a continuous basis.

15. In an all-electronic, all-channel digital tuning system of the type for tuning to any television channel by its FCC-allocated channel number wherein; channel number counters are operated on a sample basis to derive system tuning based upon the local oscillator frequency; a channel number comparator compares derived channel numbers with selected desired channel numbers for controlling the local oscillator frequency; a modular counter in the channel number counters includes residue states corresponding to intra-channel frequencies; and wherein the channel number comparator accepts more than one residue state of the modular counter to produce a restricted range of acceptable frequencies within each numbered channel, band the improvement comprising:
    means for initially tuning said system to a particular frequency within any channel band including:
    a phase comparator and reference signal source establishing a phase lock loop for controlling the local oscillator frequency based upon the frequency of comparison pulses from said channel number comparator and said reference signal; and
    means disabling said phase lock loop when system tuning corresponds to said particular frequency.

16. The tuning system of claim 15 further including an automatic frequency control circuit operable within said restricted range of acceptable frequencies; and means disabling said automatic frequency control circuit when said phase lock loop is established.

17. The tuning system of claim 16 wherein said phase comparator controls said local oscillator frequency;

said channel number comparator producing equality pulses whenever the derived and desired channel numbers are equal and the modular counter is in an acceptable state; and tuning cycle means re-establishing said phase lock loop whenever said channel number comparator indicates system tuning has departed from the restricted range of acceptable frequencies in any numbered channel band.

18. The tuning system of claim 17 wherein said tuning cycle means establishes said phase lock loop by reconfiguring the system such that said channel number counters are operated on a continuous basis.

19. The tuning system of claim 18, further including a clock controlling said tuning cycle means to provide a predetermined time interval for phase lock loop operation.

20. A television tuning system for tuning to a window of acceptable frequencies about a particular frequency in any FCC-allocated television channel band comprising:

means deriving channel number information indicative of system tuning;

desired channel number information generation means;

comparison means comparing derived and desired channel number information and producing a comparison signal indicative of the comparison;

initial means tuning said system to said particular frequency corresponding to said generated channel number information; and tuning cycle means, responsive to said system being substantially tuned to said particular frequency, disabling said initial means and conditioning said system for maintaining system tuning within said window.

21. The tuning system of claim 20 wherein said tuning cycle means enables said initial means whenever system tuning goes outside said restricted frequency range.

22. The tuning system of claim 21 wherein said initial means comprise a phase lock loop.

23. A television tuning system for tuning to any FCC-allocated television channel band comprising:

means deriving channel number information indicative of system tuning;

desired channel number information generation means;

first comparison means comparing derived and desired channel number information and producing a comparison signal indicative of the comparison;

phase lock loop means including a reference signal, and second comparison means comparing said comparison signal and said reference signal and producing a tuning control signal responsive thereto;

control means adjusting system tuning under control of said phase lock loop means to a particular frequency in the selected television channel band; and tuning cycle means disabling said phase lock loop means when said system is substantially tuned to said particular frequency and conditioning said system for maintaining tuning within a restricted frequency range about said particular frequency.

24. The television tuning system of claim 23 wherein said tuning cycle means operates automatically after a predetermined interval of phase lock loop means operation.

25. The television tuning system of claim 24 wherein said tuning system operates on a digital basis and includes a voltage controllable local oscillator establishing system tuning;

modular counting means deriving said derived channel number information based upon the frequency of the local oscillator, said tuning cycle means conditioning said modular counting means for continuous counting when said phase lock loop means is operating and for counting on a sample basis at other times.

26. The television tuning system of claim 25 wherein said modular counting means includes an asynchronously sampled modular counter section having states corresponding to intrachannel band fractional frequencies, said first comparison means accepting adjacent ones of said states for defining said restricted frequency range.

27. The television tuning system of claim 26, further including automatic frequency control means having an overall pull-in range substantially equal to said restricted frequency range;

said automatic frequency control means being disabled when said phase lock loop is operating.

28. The television tuning system of claim 27 wherein said tuning cycle means reinitiates phase lock loop means operation responsive to said comparison signal indicating system tuning has gone outside said restricted frequency range.

29. An all electronic, all-channel tuning system for tuning to any desired channel band in the FCC-allocated television frequency bands by channel number, said system having an initial single frequency tuning mode and a subsequent window tuning mode, comprising:

a tuner including a voltage-controllable local oscillator;

counter means coupled to said oscillator deriving channel numbers corresponding to actual system tuning;

channel selection means producing desired channel numbers indicative of desired system tuning;

a channel number comparator comparing derived and desired channel numbers and producing a comparison signal based upon the comparison;

a phase lock loop including a reference signal and a phase comparator comparing said comparison signal with the reference signal and producing a tuning control signal;

driving means driving said voltage controllable local oscillator responsive to said tuning control signal; and tuning cycle means, activated in response to a tuning change signal, enabling said driving means to initially tune said system to a particular frequency corresponding to the FCC-allocated number of the selected channel band and, after said system is substantially tuned to said particular frequency, release said tuning system to a tuning condition where said local oscillator is tuned to a restricted range of frequencies about said particular frequency.

30. The tuning system of claim 29, further including automatic frequency control means operable during said window tuning mode for maintaining system tuning within said restricted range of frequencies.

31. The tuning system of claim 30 wherein said tuning cycle means re-enables said driving means to tune to said particular frequency if system tuning goes outside said restricted range of frequencies.

32. The tuning system of claim 31 further including a phase lock loop operable during said single frequency tuning mode for tuning said system to said particular frequency.

33. An all-electronic, all-channel tuning system for tuning to any desired channel in the FCC-allocated television frequency bands, said system having an initial phase lock loop tuning mode and a subsequent window tuning mode, comprising:
   a tuner including a voltage-controllable local oscillator;
   counter means coupled to said oscillator deriving channel number information indicative of actual system tuning;
   channel selection means producing desired channel number information indicative of desired system tuning;
   a channel number information comparator comparing derived and desired channel number information and producing an equality pulse upon coincidence therebetween;
   a source of reference frequency;
   phase comparator means comparing the phase and frequency of said reference frequency with the phase and frequency of the equality pulses from said channel number information comparator;
   tuning means driving said voltage-controllable local oscillator from said phase comparator means; and
   tuning cycle means conditioning said counter means for continuous operation during said phase lock loop tuning mode and for sampling operation during said window tuning mode, said system tuning corresponding to a particular frequency in the selected channel band, when in said phase lock loop mode, and corresponding to a restricted range of frequencies about said particular frequency in the selected channel band when in said window mode.

34. The tuning system of claim 33 including a clock, controlling the duration of said phase lock loop tuning mode.

35. The tuning system of claim 34 wherein said counter means includes a modular counter having states corresponding to intrachannel fractional frequencies;
   said channel number information comparator being programmed to accept residues in said modular counter corresponding to adjacent states for determining said restricted range of frequencies when in said window mode.

36. The tuning system of claim 35 further including and automatic frequency control circuit, under control of said tuning cycle means, said automatic frequency control circuit being operable in said window tuning mode and being disabled in said phase lock loop tuning mode.

37. The tuning system of claim 36 wherein said tuning cycle means reinitiates said phase lock loop tuning mode responsive to said equality pulses indicating system tuning is no longer within said restricted frequency range.

38. The tuning system of claim 37 further including window width means for changing the acceptable residues of said modular counter, thereby varying said restricted frequency range.

* * * * *